(12) United States Patent
Vice

(10) Patent No.: US 7,053,701 B2
(45) Date of Patent: May 30, 2006

(54) POWER AMPLIFIER OUTPUT STAGE WITH MULTIPLE POWER STATES AND IMPROVED EFFICIENCY

(76) Inventor: Michael W. Vice, 532 Palma St., El Granada, CA (US) 94018

( * ) Notice: Subject to any disclaimer, the term of this patent is extended or adjusted under 35 U.S.C. 154(b) by 0 days.

(21) Appl. No.: 10/702,018

(22) Filed: Nov. 4, 2003

(65) Prior Publication Data

US 2005/0093633 A1   May 5, 2005

(51) Int. Cl.
  *H03F 1/14*   (2006.01)
  *H03F 3/68*   (2006.01)
  *H03F 3/191*  (2006.01)
(52) U.S. Cl. .................. 330/51; 330/124 R; 330/302
(58) Field of Classification Search ................ 330/51, 330/124 R, 295, 302
See application file for complete search history.

(56) References Cited

U.S. PATENT DOCUMENTS

| | | | |
|---|---|---|---|
| 4,755,769 A | 7/1988 | Katz | |
| 5,541,554 A | 7/1996 | Stengel et al. | |
| 5,548,246 A | 8/1996 | Yamamoto et al. | |
| 6,128,479 A * | 10/2000 | Fitzpatrick et al. | 455/137 |
| 6,781,455 B1 * | 8/2004 | Kim | 330/51 |

FOREIGN PATENT DOCUMENTS

WO   WO 2004/034569   4/2004

* cited by examiner

*Primary Examiner*—Steven J. Mottola

(57) ABSTRACT

A power amplifier output stage that provides multiple power states and mechanisms for enhancing the efficiency of each of its power states. A power amplifier output stage according to the present techniques includes a first output device for driving a load in a first power state and a second output device for driving the load in a second power state along with a matching network for the first power state and a circuit for adapting the matching network to the second power state.

18 Claims, 2 Drawing Sheets

POWER AMPLIFIER OUTPUT STAGE WITH MULTIPLE POWER STATES AND IMPROVED EFFICIENCY

BACKGROUND

Power amplifiers may be employed in a wide variety of electronic systems. For example, power amplifiers may be employed in transmitters to generate transmit signals. Transmitters may be employed in a wide variety of electronic systems including mobile communication devices.

A power amplifier may be characterized by an output power and an efficiency. The efficiency of a power amplifier may be defined as a ratio of the output power of the power amplifier and an amount of DC power consumed at an output of the power amplifier.

It may be desirable in a variety of electronic systems to employ a power amplifier having a relatively high efficiency. For example, a high efficiency power amplifier for a transmitter in a mobile communication device may reduce power consumption and increase battery life.

It may also be desirable in a variety of electronic systems to vary the output power of a power amplifier. For example, it may be desirable in a mobile communication device to increase the strength of a transmit signal when the mobile communication device is far away from a base station and to decrease the strength of the transmit signal when the mobile communication device is close to a base station.

A power amplifier having a variable amount of output power may exhibit its maximum efficiency at a predetermined amount of output power. For example, a power amplifier in a transmitter for a mobile communication device may be designed for maximum efficiency at its maximum output power. Unfortunately, an amplifier designed for maximum efficiency at its maximum output power may exhibit a substantially reduced efficiency at lower amounts of output power. A lower efficiency at low power may waste the DC supply power in an electronic device and decrease battery life in a mobile device.

SUMMARY OF THE INVENTION

A power amplifier output stage is disclosed that provides multiple power states and mechanisms for enhancing the efficiency of each of its power states. A power amplifier output stage according to the present techniques includes a first output device for driving a load in a first power state and a second output device for driving the load in a second power state along with a matching network for the first power state and a circuit for adapting the matching network to the second power state.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
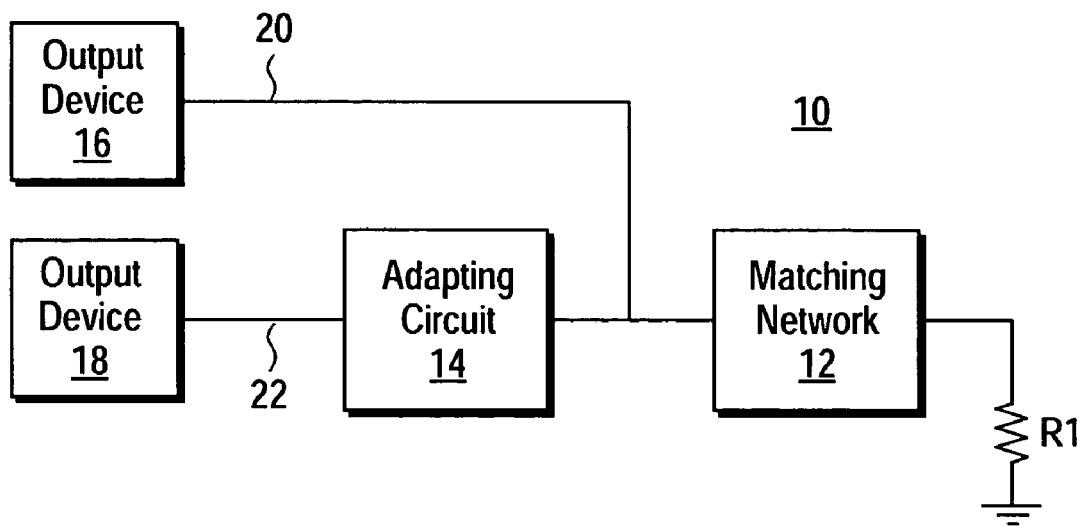
FIG. 1 shows a power amplifier output stage according to the present teachings.

FIG. 1 shows a power amplifier output stage 10 according to the present teachings. The power amplifier output stage 10 includes a pair of output devices 16 and 18, a matching network 12, and an adapting circuit 14. The power amplifier output stage 10 drives a load that is represented by a load resistor R1.

The output devices 16 and 18 drive the load resistor R1 in a high power state and a low power state, respectively, of the power amplifier output stage 10. The output devices 16 and 18 may be field-effect transistors or bipolar junction transistors. The size of the output device 16 is preferably substantially larger than the size of the output device 18 and is preferably biased to a proportionally higher electrical current operating point.

The output device 16 drives the load resistor R1 via the matching network 12 in the high power state. The matching network 12 provides impedance matching between an output node 20 of the output device 16 and the load resistor R1. The matching network 12 is tuned to optimize the efficiency of the power amplifier output stage 10 in the high power state by transforming R1 to the desired impedance at the output node 20 given the DC supply voltage to the output device 16.

The output device 18 drives the load resistor R1 via the adapting circuit 14 and the matching network 12 in the low power state. The adapting circuit 14 adapts the impedance matching at the output node 20 provided by the matching network 12 to that needed at an output node 22 of the output device 18 to optimize the efficiency of the power amplifier output stage 10 in the low power state.

Figure 2:
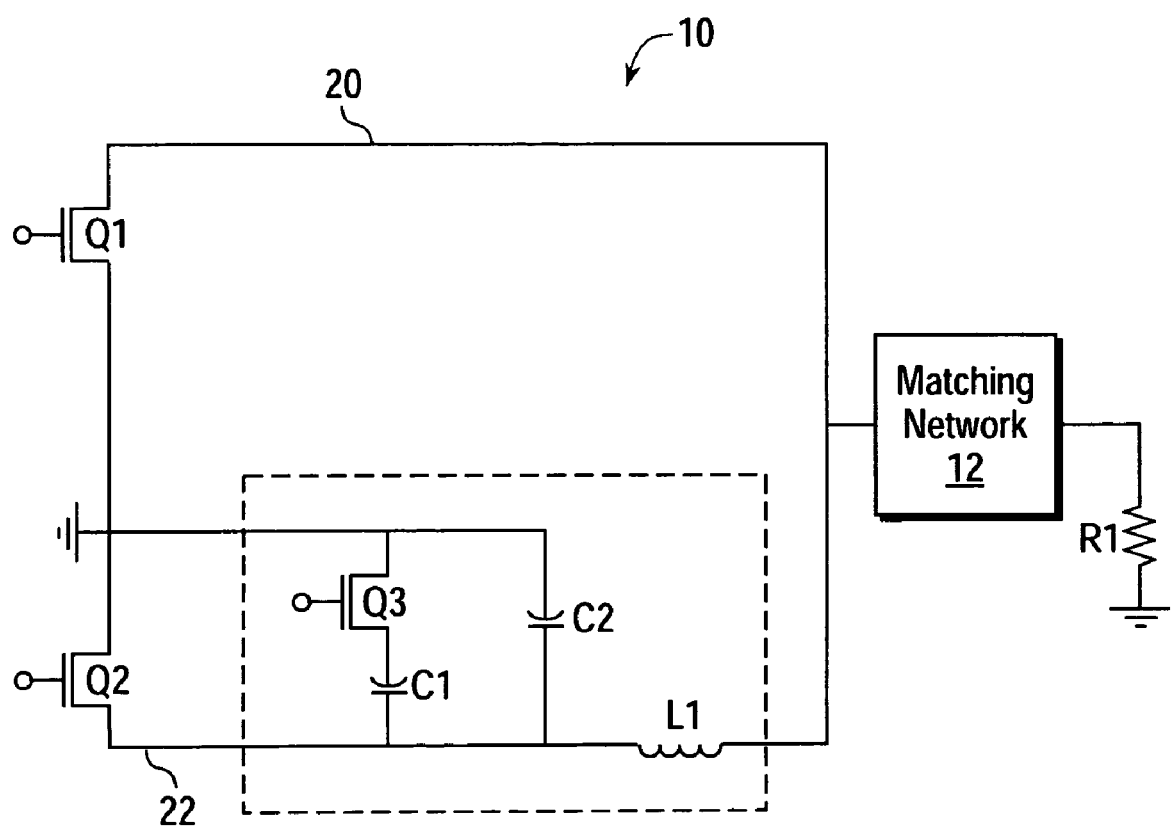
FIG. 2 shows one embodiment of a power amplifier output stage.

FIG. 2 shows one embodiment of the power amplifier output stage 10. The output devices 16 and 18 are embodied as a pair of field-effect transistors Q1 and Q2. The transistor Q1 is substantially larger than the transistor Q2 and is used in the high power state. The transistor Q2 is used in the low power state.

The adapting circuit 14 includes a field-effect transistor Q3 for switching the power amplifier output stage 10 between its high and low power states. The transistor Q3 is switched on, i.e. closed, in the high power state and switched off, i.e. opened, in the low power state. In other embodiments, the transistor Q3 may be a bipolar junction transistor or a mechanical switch or a PIN diode device.

The adapting circuit 14 includes a capacitor C2 and an inductor L1. The values of the capacitor C1 and the inductor L1 are selected to transform the impedance at the output node 20 to a desired impedance at the output node 22. The adapting circuit 14 also includes a capacitor C1 that blocks DC current flow through the transistor Q3.

In the high power state, the transistor Q3 is closed, the transistor Q1 is driven with an input waveform, and the transistor Q2 is not driven. The closed transistor Q3 shorts out the capacitor C2 and the inductor L1 appears as a shunt on the output node 20. The closed transistor Q3 effectively removes the transistor Q2 from the circuit and the matching network 12 appears in parallel with the inductor L1 at the output node 20. The matching network 12 is tuned to absorb the inductance of the inductor L1 in order to properly load the output node 20 of the transistor Q1 for efficiency in the high power state.

In the low power state, the transistor Q3 is open, the transistor Q2 is driven with an input waveform, and the transistor Q1 is not driven. The capacitor C2 and the inductor L1 transform the impedance at the output node 20 up to a desired impedance at the output node 22. As a consequence, the transistor Q2 delivers a lower power output signal to a higher impedance load, thereby increasing efficiency in the low power state.

The value of the inductor L1 may be limited to have only a minor effect on the operation of the power amplifier output stage 10 in the high power state. Similarly, the loss associated with the transistor Q3 has only a minor effect on the operation of the power amplifier output stage 10 in the high power state. The power amplifier output stage 10 does not cause power to flow through switching devices and thereby avoids the insertion loss that may occur in prior power amplifiers.

Figure 3:
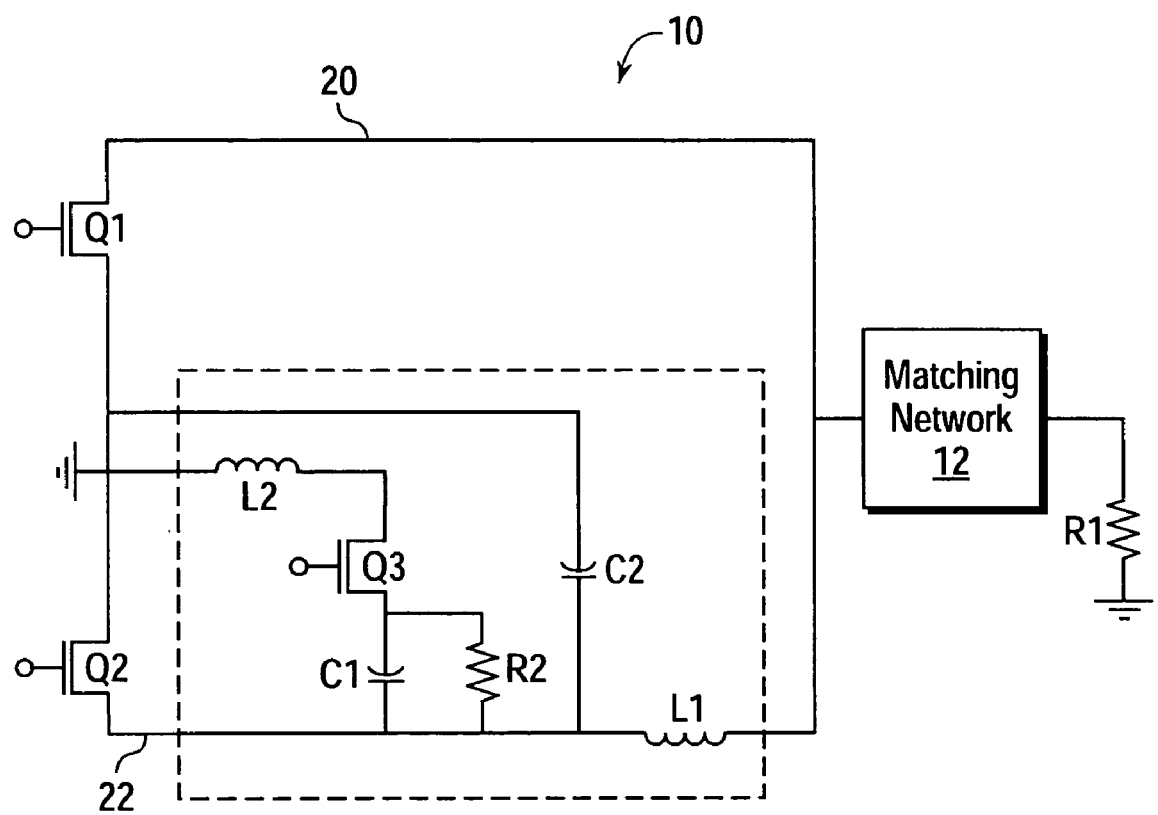
FIG. 3 shows another embodiment of a power amplifier output stage.

FIG. 3 shows an embodiment of the power amplifier output stage 10 that includes an inductor L2 between the source of the transistor Q3 and ground. The value of the capacitor C2 is relatively large so that it appears as a short circuit. As a consequence, when the transistor Q3 is closed the inductor L2 appears to be across the capacitor C2. The value of the inductor L2 is selected so that it resonates with the capacitor C2 when the transistor Q3 is closed. The net result is an open circuit between the output node 22 and ground. This effectively removes the inductor L1 from the circuit in the high power state and prevents the inductor L1 from loading the output node 20.

The power amplifier output stage 10 in this embodiment also includes a resistor R2 placed in parallel with the capacitor C1. The resistor R2 has a relatively large value, e.g. 5k ohms. The resistor R2 enables a DC bias voltage to be maintained at a channel terminal (e.g. drain or source) of the transistor Q3 when the transistor Q3 is off, i.e. in the low power state. The DC bias voltage at the channel terminal of the transistor Q3 helps keep the transistor Q3 off to maintain the low power state linearity. This avoids a negative voltage on the drain that might switch the transistor Q3 on and disrupt the low power state. The DC bias voltage at the output node 22 shifts the low voltage peaks of an output waveform from the transistor Q2 away from a level that might otherwise switch on the transistor Q3.

The inductor L2 preferably has a relatively high Q factor. The inductor L2 may be implemented as a gold wire that is bonded to an underlying ground plane using thermal compression. It may be desirable to keep the on resistance of the transistor Q3 relatively low because the effective Q of inductor L2 takes into account the on resistance of the transistor Q3.

The inductor L2 in other embodiments may be placed anywhere in the circuit branch from the capacitor C1 to the transistor Q3 to ground. In addition, the source and drain of the transistor Q3 may be flipped in other embodiments.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A power amplifier, comprising:
    first output device for driving a load in a first power state;
    second output device for driving the load in a second power state such that the first output device does not drive the load in the second power state and the second output device does not drive the load in the first power state;
    adapting circuit coupled between the first output device and the second output device that adapts a matching network for the first power state to the second power state.

2. The power amplifier of claim 1, wherein the adapting circuit includes a set of components for transforming an impedance presented to an output node of the first output device to an impedance presented to an output node of the second output device.

3. The power amplifier of claim 2, wherein the impedance presented to the output node of the second output device is selected to optimize an efficiency of the power amplifier in the second power state.

4. The power amplifier of claim 2, wherein the impedance presented to the output node of the first output device is selected to optimize an efficiency of the power amplifier in the first power state.

5. The power amplifier of claim 1, wherein the adapting circuit includes a device for switching between the first and second power states.

6. A power amplifier, comprising:
    first output device for driving a load in a first power state;
    second output device for driving the load in a second power state;
    matching network for the first power state;
    circuit for adapting the matching network to the second power state wherein the circuit for adapting includes a device for switching between the first and second power states and a circuit for maintaining an off state of the device for switching when in the second power state.

7. The power amplifier of claim 1, wherein the first power state is a higher power state and the second power state is a lower power state.

8. A power amplifier, comprising:
    first output device for driving a load in a first power state;
    second output device for driving the load in a second power state such that the first output device does not drive the load in the second power state and the second output device does not drive the load in the first power state;
    circuit for adapting a matching network for the first power state to the second power state wherein the circuit for adapting includes a capacitor and an inductor that are selected to transform an impedance presented to an output node of the first output device to an impedance presented to an output node of the second output device.

9. A power amplifier, comprising:
    first output device for driving a load in a first power state;
    second output device for driving the load in a second power state;
    matching network for the first power state;
    circuit for adapting the matching network to the second power state wherein the circuit for adapting includes a capacitor and an inductor that are selected to transform an impedance presented to an output node of the first output device to an impedance presented to an output node of the second output device and further comprising a circuit for preventing the inductor from substantially loading the output node of the first output device in the first power state.

10. A method for providing multiple power states in a power amplifier, comprising:
    providing a first output device for driving a load in a first power state;
    providing a second output device for driving the load in a second power state such that the first output device does not drive the load in the second power state and the second output device does not drive the load in the first power state;

adapting a matching network for the first power state to the second power state by coupling an adapting circuit between the first output device and the second output device.

11. The method of claim 10, wherein adapting includes transforming an impedance presented to an output node of the first output device to an impedance presented to an output node of the second output device.

12. The method of claim 11, further comprising selecting the impedance presented to the output node of the second output device to optimize an efficiency of the power amplifier in the second power state.

13. The method of claim 10, further comprising selecting the impedance presented to the output node of the first output device to optimize an efficiency of the power amplifier in the first power state.

14. The method of claim 10, wherein adapting includes switching a device for switching between the first and second power states.

15. A method for providing multiple power states in a power amplifier, comprising:
 providing a first output device for driving a load in a first power state;
 providing a second output device for driving the load in a second power state;
 providing a matching network for the first power state;
 adapting the matching network to the second power state wherein adapting includes switching a device for switching between the first and second power states and maintaining an off state of the device for switching when in the second power state.

16. The method of claim 10, wherein providing a first output device for driving a load in a first power state comprises providing the first output device for driving the load in a higher power state and providing a second output device for driving the load in a second power state comprises providing the second output device for driving the load in a lower power state.

17. A method for providing multiple power states in a power amplifier, comprising:
 providing a first output device for driving a load in a first power state;
 providing a second output device for driving the load in a second power state such that the first output device does not drive the load in the second power state and the second output device does not drive the load in the first power state;
 adapting a matching network for the first power state to the second power state wherein adapting includes selecting a capacitor and an inductor to transform an impedance presented to an output node of the first output device to an impedance presented to an output node of the second output device.

18. A method for providing multiple power states in a power amplifier, comprising:
 providing a first output device for driving a load in a first power state;
 providing a second output device for driving the load in a second power state;
 providing a matching network for the first power state;
 adapting the matching network to the second power state wherein adapting includes selecting a capacitor and an inductor to transform an impedance presented to an output node of the first output device to an impedance presented to an output node of the second output device and further comprising preventing the inductor from substantially loading the output node of the first output device in the first power state.

* * * * *